(12) United States Patent
Li et al.

(10) Patent No.: US 10,211,679 B1
(45) Date of Patent: Feb. 19, 2019

(54) HYBRID SOURCE OF ENERGY SUPPLY SCHEME FOR INTERNET OF THINGS SYSTEM ON CHIP

(71) Applicant: Spatiallink Corporation, Irvine, CA (US)

(72) Inventors: Qiang Li, Irvine, CA (US); Ming Yu Lin, Tustin, CA (US)

(73) Assignee: SPATIALLINK CORPORATION, Irvine, CA (US)

( * ) Notice: Subject to any disclaimer, the term of this patent is extended or adjusted under 35 U.S.C. 154(b) by 127 days.

(21) Appl. No.: 15/253,067

(22) Filed: Aug. 31, 2016

Related U.S. Application Data

(60) Provisional application No. 62/212,362, filed on Aug. 31, 2015.

(51) Int. Cl.
| | |
|---|---|
| *H02J 50/20* | (2016.01) |
| *H02M 7/23* | (2006.01) |
| *H02J 50/10* | (2016.01) |
| *H03H 7/38* | (2006.01) |
| *H02J 5/00* | (2016.01) |
| *G06K 19/07* | (2006.01) |

(52) U.S. Cl.
CPC .............. *H02J 50/20* (2016.02); *H02M 7/23* (2013.01); *G06K 19/0708* (2013.01); *H02J 5/005* (2013.01); *H02J 50/10* (2016.02); *H03H 7/38* (2013.01)

(58) Field of Classification Search
CPC . H02J 5/005; H02J 7/025; H02J 17/00; H04B 5/0025–5/0093; G06K 19/0707–19/0711
See application file for complete search history.

(56) References Cited

U.S. PATENT DOCUMENTS

| | | | | |
|---|---|---|---|---|
| 2001/0051766 A1* | 12/2001 | Gazdzinski | ........ | A61B 1/00016 600/309 |
| 2006/0084392 A1* | 4/2006 | Marholev | ............ | H04B 5/0093 455/78 |
| 2009/0033467 A1* | 2/2009 | Finocchiaro | ............. | H04B 5/00 340/10.1 |
| 2012/0056485 A1* | 3/2012 | Haruyama | .............. | H02J 5/005 307/104 |

(Continued)

*Primary Examiner* — Rexford Barnie
*Assistant Examiner* — David Shiao

(57) ABSTRACT

A system using a hybrid source of energy supply scheme is disclosed. The system includes a first circuit configured to transmit and receive electromagnetic waves, where the first circuit is configured to operate in one of a plurality of operation modes, where the plurality of operation modes includes a normal operation mode, an energy harvesting mode, and a sleep mode. The system further includes a second circuit coupled to the first circuit and configured in one of the plurality of operation modes. The second circuit includes at least one of a receiver or a transmitter, and a third circuit coupled to the first circuit and the second circuit. The third circuit configured to the normal operation mode when the first circuit is configured in the normal operation mode and the second circuit is configured in a normal operation mode. Further, the third circuit is configured to the energy harvesting mode when the first circuit is configured in the energy harvesting mode and the second circuit is configured in the sleep mode.

15 Claims, 8 Drawing Sheets

(56) References Cited

U.S. PATENT DOCUMENTS

| | | | | |
|---|---|---|---|---|
| 2012/0231729 A1* | 9/2012 | Xu | ............... | G01S 19/21 |
| | | | | 455/13.4 |
| 2012/0256492 A1* | 10/2012 | Song | ............... | H02J 1/102 |
| | | | | 307/66 |
| 2016/0155040 A1* | 6/2016 | Patterson | ............... | G06K 19/0708 |
| | | | | 235/492 |
| 2016/0156219 A1* | 6/2016 | Copeland | ............... | G07C 9/00007 |
| | | | | 307/52 |
| 2016/0254844 A1* | 9/2016 | Hull | ............... | H04B 5/0062 |
| | | | | 340/6.1 |
| 2017/0189694 A1* | 7/2017 | Palmer | ............... | A61N 1/3787 |
| 2017/0237469 A1* | 8/2017 | Taghivand | ............... | H02J 50/20 |
| | | | | 455/41.1 |

* cited by examiner

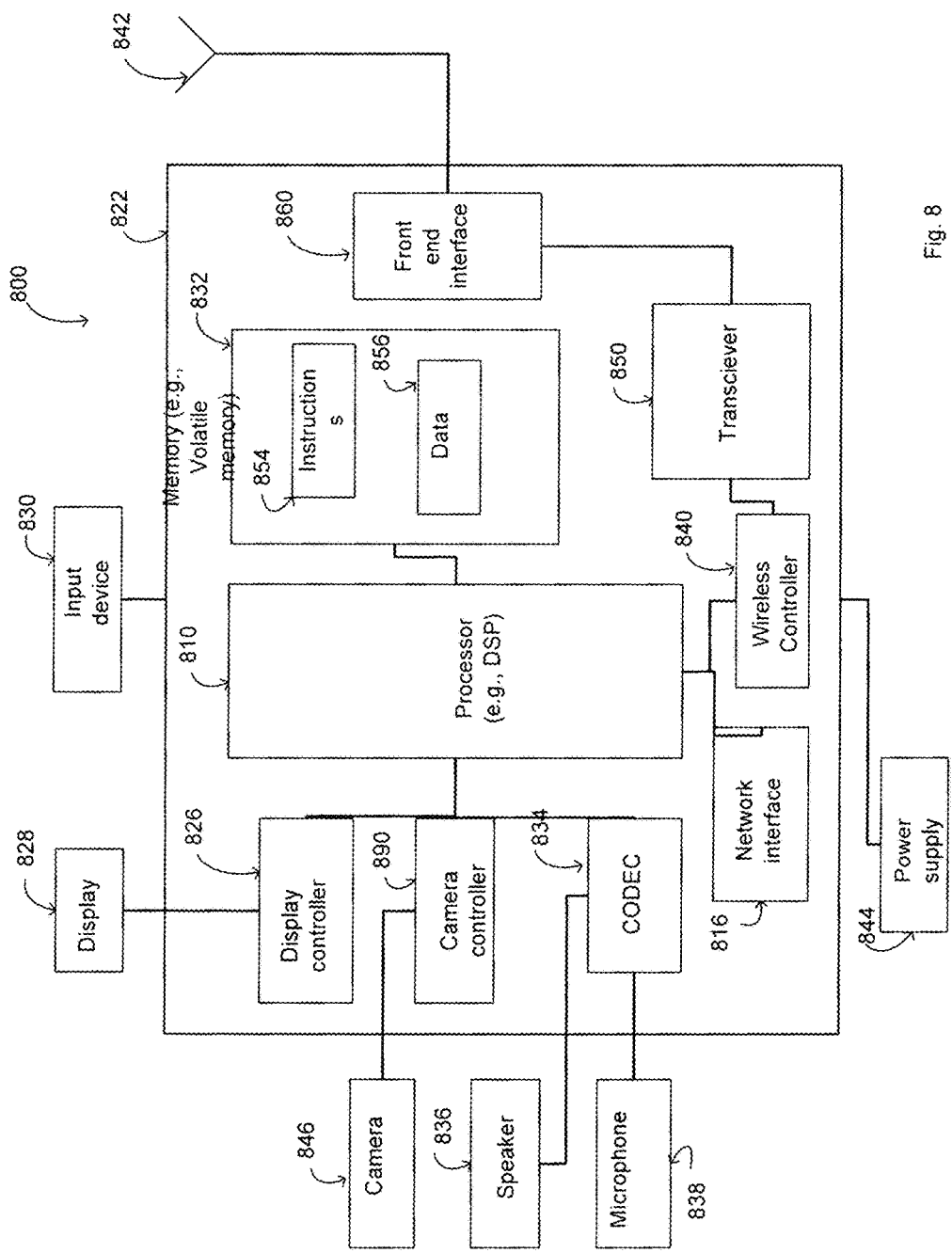

US 10,211,679 B1

HYBRID SOURCE OF ENERGY SUPPLY SCHEME FOR INTERNET OF THINGS SYSTEM ON CHIP

CROSS REFERENCE TO RELATED APPLICATIONS

The present disclosure claims the benefit of U.S. Provisional Application No. 62/212,362 entitled "Hybrid Supply Scheme for Internet of Things (IoT) System on Chip (SoC)", filed on Aug. 31, 2015, and of U.S. Provisional Application No. 62/212,066 entitled "Energy Harvesting Scheme for Internet of Things (IoT) System on Chip (SoC)", filed on Aug. 31, 2015, each of which is hereby incorporated by reference in its entirety for all purposes.

TECHNICAL FIELD

The present disclosure generally relates to a wireless system on chip (SoC) and in particular to energy harvesting for an Internet of Things (IoT) wireless SoC using a hybrid source of energy supply scheme.

BACKGROUND

Increasingly wireless systems are evaluated on their power consumption capabilities. A low-power consumption wireless system is highly desired since this generally translates directly to a longer battery life of a wireless device. There are a number of techniques in the art to help lower the power consumption of a wireless device. For example, wireless systems may be designed to operate and switch between multiple modes, such as an active mode and a low power mode, where in the active mode the power consumption is higher than the low power mode. Another approach is to introduce a sleep mode once the system is detected not to be in an active mode or a low power mode. In some cases, in a sleep mode, only very few vital components are turned ON in anticipation of awakening the system to an active mode or a low power mode. In a sleep mode, the power consumption of the system is at its minimal level.

However, power to operate in any of these modes is supplied from the battery, i.e. the source of energy of the wireless system. Hence it is a limited source. Although the techniques to lower power consumption elongate the battery life of the wireless system; they do not provide an alternative source of energy to supplement the battery of the wireless system. Accordingly, there is a need in the art for an alternative energy source that will help to extend the battery life or in general to supplement the source of energy of the wireless system.

SUMMARY

The disclosed subject matter relates to a wireless system (IoT) on chip (SoC) using a hybrid source of energy supply scheme. The system includes a first circuit configured to transmit and receive electromagnetic waves. The first circuit is configured to operate in one of a plurality of operation modes, where the plurality of operation modes includes a normal operation mode, an energy harvesting mode, and a sleep mode. The system further includes a second circuit coupled to the first circuit and configured in one of the plurality of operation modes. The second circuit includes at least one of a receiver or a transmitter, and a third circuit coupled to the first circuit and the second circuit. The third circuit is configured to the normal operation mode when the first circuit is configured in the normal operation mode and the second circuit is configured in a normal operation mode. Further, the third circuit is configured to the energy harvesting mode when the first circuit is configured in the energy harvesting mode and the second circuit is configured in the sleep mode.

The disclosed subject matter relates to a device. The device includes a first circuit that includes a transformer with a primary winding set, where the primary winding set has a first end and a second end, an n-type-metal-oxide-semiconductor-field-effect-transistor (NMOSFET), and a p-type-metal-oxide-semiconductor-field-effect-transistor (PMOSFET). The second end is coupled to the drain of the NMOSFET and the drain of the PMOSFET, and the NMOSFET and PMOSFET are configurable to an ON mode and an OFF mode via a first control signal received at the gate of the PMOSFET and a second control signal received at the gate of the NMOSFET. The device further includes an antenna circuit to transmit and receive electromagnetic waves where the antenna circuit is coupled to the first end.

The disclosed system further relates to a method for configuring an IoT system in a normal operation mode and a harvesting operation mode. The method includes determining whether a second circuit is in a sleep mode or a normal operation mode, setting a first circuit in the normal operation mode when the second circuit is in the normal operation mode, and setting a third circuit to the normal operation mode when the second circuit is in the normal operation mode. The method further includes setting the first circuit in an energy harvesting mode when the second circuit is in the sleep mode, and setting the third circuit to an energy harvesting mode when the second circuit is in the sleep mode, wherein setting the first circuit in an energy harvesting mode yields harvested energy.

It is understood that other configurations of the subject technology will become readily apparent to those skilled in the art from the following detailed description, wherein various configurations of the subject technology are shown and described by way of illustration. As will be realized, the subject technology of other different configurations and its several details are capable of modifications in various other respects, all without departing from the subject technology. Accordingly, the drawings and the detailed description are to be regarded as illustrative in nature and not restrictive.

BRIEF DESCRIPTION OF DRAWINGS

Certain features of the present disclosure are set forth in the appended claims. However, for purpose of explanation, several implementations of the present disclosure are set forth in the following figures.

FIG. 8 illustrates conceptually an example electronic system with which some implementations of the present disclosure may be implemented.

Embodiments of the present disclosure and their advantages are best understood by referring to the detailed description that follows. It should be appreciated that like-reference-numerals are used to identify like-elements illustrated in one or more of the figures.

DETAILED DESCRIPTION

The detailed description includes specific details for the purpose of providing a thorough understanding of the present disclosure. However, the present disclosure is not limited to the specific details set forth herein and may be practiced without these specific details. In some instances, structures and components are shown in block diagram form to avoid obscuring the concept of the present disclosure.

In wireless technology, a transmitter propagates or transmits electromagnetic waves to be received by a receiver in an attempt to transmit information from the transmitter to the receiver (hereafter referred to as the normal operation mode). Conventionally a receiver in a sleep mode is not operative to receive information, yet the transmitter continues to transmit the electromagnetic waves while the receiver is in the sleep mode for a variety of reasons, such as to allow the transmitter to another receiver when that receiver is no longer in the sleep mode. The present disclosure proposes harvesting the electromagnetic waves from the transmitter while the receiver is in the sleep mode by introducing a hybrid source of energy supply scheme.

In some cases, a wireless transceiver may require as low as a 1 micro-ampere current to operate in a sleep mode and to perform operations such as waking up the wireless transceiver. On the other hand, operating the wireless transceiver in a normal operation mode may require a higher current (e.g., as much as 10 milli-ampere). Operating in a normal operation may cover operations such as active mode, low power mode, sensing functionality and power transmission. For example, a presence of a 1 milli-watt electromagnetic wave at the receiver may result in charging a capacitor of 33 micro-farads up to 1.6 Volt in as short as 20 minutes. This harvested energy is usually capable of providing the necessary current to perform sleep mode operations.

The present disclosure discloses an IoT wireless system with a hybrid source of energy supply scheme. The hybrid source of energy supply scheme introduces a field power supply unit (FPSU) and an antenna interface that include circuitry operating a wireless system such as the IoT system in a normal operation mode and an energy harvesting mode where the harvested energy is stored and retrieved at a later time. For instance, the harvested energy in the energy harvesting mode may be used to operate the IoT wireless system during the sleep mode and to wake up the wireless system from the sleep mode. The normal operation mode is an active operation mode or a low power operation mode.

Figure 1:
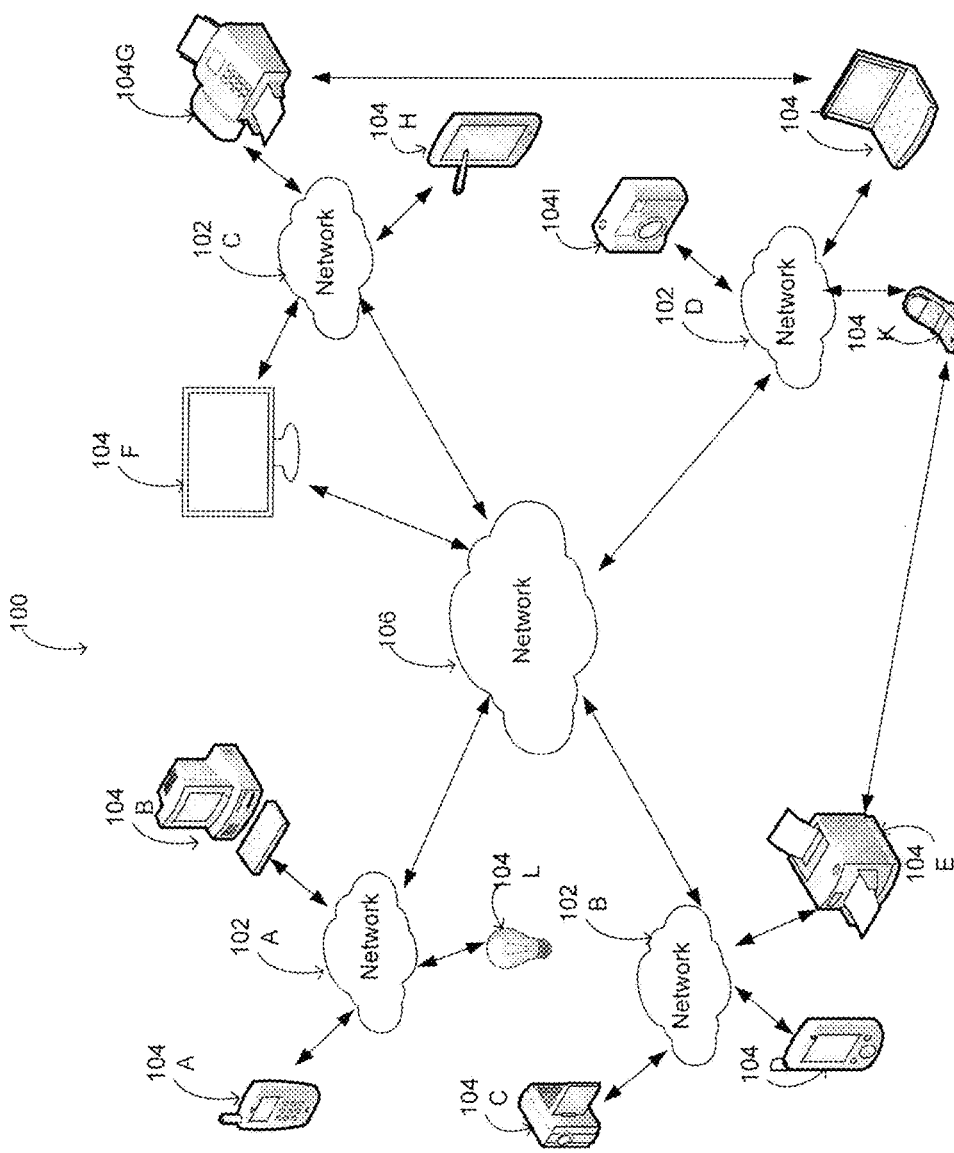
FIG. 1 illustrates an exemplary network environment for implementing an IoT system in accordance with one or more embodiments of the present disclosure.

FIG. 1 illustrates an exemplary network environment 100 for implementing an IoT system in accordance with one or more embodiments of the present disclosure. Not all of the depicted components may be required. However, one or more implementations may require additional components, fewer components or different component not shown in network environment 100. Thus, any variations in network environment 100 may be implemented without departing from the scope of the present disclosure.

Network environment 100 may be a number of networks such an IoT network, a private network, the internet, any other network, or combinations thereof. The network environment 100 includes networks 102A, 102B, 102C, 102D (hereafter referred to as 102A-102D) and 106. Network environment 100 includes a number of electronic devices 104A, 104B, 104C, 104D, 104E, 104F, 104G, 104H, 104I, 104J, 104K, 104L (hereafter referred to as 104A-104L). One or more of the devices 104A-104L, such as device 104A, may be a device capable of communicating with one or more of devices 104A-104L (e.g., via wired or wireless communication). In some aspects, the devices 104A-104L may include, may be embedded in, or may be coupled to a portable communication device, such as a mobile phone, a laptop, a tablet or any other communication device. The devices 104A-104L may be communicably coupled to one or more of the networks 102A-102D, 106 and/or to one or more other devices of the devices 104A-104L. As shown in FIG. 1 examples of devices 104A-104L may include a computer, a desktop, a laptop, a tablet, a fax machine, a printer, light bulb and so forth.

One or more of the networks 102A-102D and 106 include one or more wired or wireless devices that facilitate devices communication, such as router devices, switch devices, relay devices, etc., and/or include one or more servers. One or more of the networks 102A-102D and 106, such as network 106 may be, or may include, a cloud of computers. One or more of the networks 102A-102D and 106 may be a local area networks that communicatively coupled one or more of the devices 104A-104D. In one or more implementations, one or more of networks 102A-102D and 106 may be referred to as an IoT network and/or a machine-to-machine (M2M) network.

One or more of the devices 104A-104L may be referred to as an IoT device and/or an M2M device. There may be multiple paths between one or more of the devices 104A-104L and/or one or more of the networks 102A-102D. One or more of the networks 102A-102D and 106 and/or devices 104A-104D are able to communicate with one another or other systems. One or more of the devices 104A-104L may include or may be a sensor that measures a physical quantity from surrounding environment and convert physical quantities into a signal. Examples of sensors include, by way of illustration only and not by way of limitation, temperature sensors, video cameras, audio recorders, motion sensors, humidity sensors, smoke detectors and other sensors.

In one or more implementations, devices 104A-104L may include one or more of active devices, passive devices and/or implemented wholly or partially as a SoC device. Devices 104A-104L may include a transmitter, a receiver, a Global Positioning System (GPS), a Bluetooth (BT) transceiver, a Wi-Fi and/or a hybrid source of energy supply scheme. In one or more implementations, networks 102A-102D and 106 may include one or more network access points, such as a wireless access point (WAP) where the WAP is always transmitting electromagnetic waves irrespective of the status of the receivers in devices 104A-104L;

allowing one or more of the devices 104A-104L to harvest energy when their receivers are not in a normal operation mode.

Figure 2:
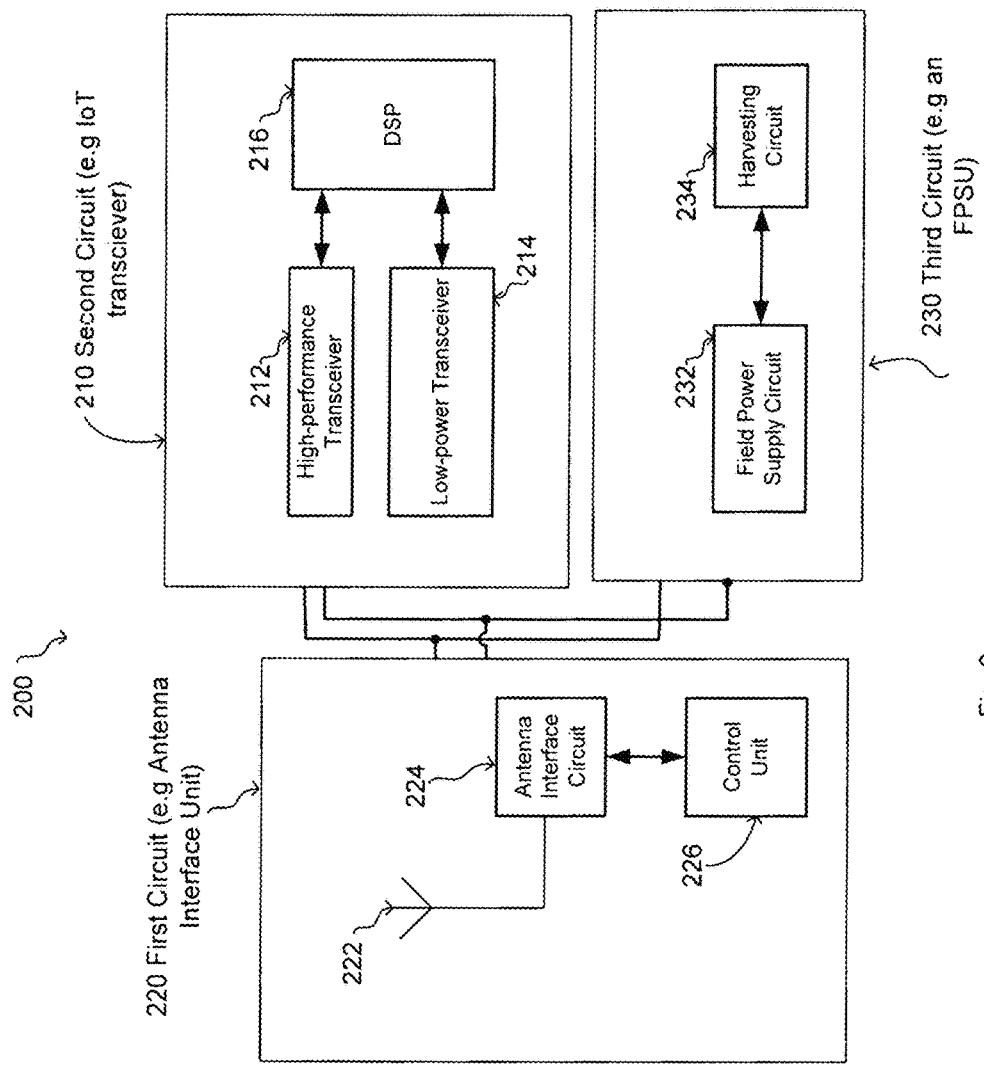
FIG. 2 illustrates a block diagram of an IoT system in accordance with one or more embodiments of the present disclosure.

FIG. 2 illustrates a block diagram of an IoT system 200 in accordance with one or more embodiments of the present disclosure. IoT system 200 may be an exemplary system or a partial system of any of the devices 104A-104L referenced in FIG. 1. IoT system 200 may include a first circuit (e.g., antenna interface unit 220 to receive or transmit electromagnetic waves), a second circuit (e.g., IoT transceiver SoC 210 to process electromagnetic waves into data and vice versa), and a third circuit (e.g., FPSU 230 to provide power to the IoT system in its different modes of operations). IoT transceiver SoC 210 may include a high-performance transceiver 212, a low-power transceiver 214 and a digital signal processing unit (DSP) 216. Antenna interface unit 220 may include an antenna circuit 222, an antenna interface circuit 224 and a control unit 226. FPSU 230 may include a field power supply circuit 232 and a harvesting circuit 234.

In some aspects, high-performance transceiver 212 (e.g., higher data rate transceivers) includes a high-power consumption receiver and a high-power consumption transmitter, while low-power transceiver 214 includes a low-power consumption receiver and a low-power consumption transmitter. In one or more implementations, the DSP unit 216 may perform modulation, demodulation and media access functionality within the IoT system 200 and in one or more implementations DSP unit 216 is a central control unit of the IoT system 200.

In at least one embodiment, IoT system 200 is operated under time division duplex (TDD) access mode, allowing antenna sharing of the antenna circuit 222 in normal operation mode and energy harvesting mode. Antenna interface unit 220 utilizes antenna interface circuit 224 to allow switching between different modes of operation of IoT system 200. In one or more implementations, the control unit 226 configures the antenna interface unit 220 to operate in either normal operation mode or energy harvesting mode by switching circuitry within the antenna interface circuit 224 to the appropriate mode of operation.

In normal operation mode, the IoT transceiver SoC 210 is configured to transmit and/or receive data. Normal operation mode may be either high-performance mode or low-power mode. In normal operation mode, the control unit 226 may configure the antenna interface unit 220 such that electromagnetic waves flow from/to the antenna interface unit 220 to/from the IoT transceiver SoC 210 while limiting electromagnetic waves flow from the antenna interface unit 220 to the FPSU 230. On the other hand, when the IoT transceiver SoC 210 is not in a normal operation mode; it may be in a sleep mode. In the sleep mode, the control unit 226 may configure the antenna interface unit 220 such that electromagnetic waves flow from the antenna interface unit 220 to the FPSU 230 while limiting electromagnetic waves flow from the antenna interface unit 220 to the IoT transceiver SoC 210. In some aspects of the current disclosure, when the IoT transceiver SoC 210 is in the sleep mode, the antenna interface unit 220 and the FPSU 230 are operated in an energy harvesting mode, where electromagnetic waves are harvested through the antenna circuit 222.

As depicted in FIG. 2, the control unit 226 detects the mode of operation of the IoT system 200, configures and operates the antenna interface unit 220 accordingly. In one or more implementation, the control unit 226 may receive instruction from the DSP unit 216 to configure the antenna interface unit 220 in a desired mode of operation. For example, during normal operation mode where the antenna interface unit 220 receives or transmits electromagnetic waves from or to the IoT transceiver SoC 210, the control unit 226 configures the antenna interface circuit 224 in normal operation mode where communication is between the antenna interface unit 220 and the IoT transceiver SoC 210. In energy harvesting mode, the antenna interface unit 220 receives electromagnetic waves via the antenna interface circuit 224 and directs the energy to the harvesting circuit 234 within the FPSU 230. The FPSU 230 provides usable power supply to both the antenna interface unit 220 and IoT transceiver SoC 210 during normal operation mode. Furthermore, in normal operation mode, the high-performance transceiver 212 and low-power transceiver 214 convert digital signals from the DSP unit 216 to an electromagnetic signal for transmission through the antenna interface unit 220 and converts the electromagnetic signal from the antenna interface unit 220 to a digital signal for the DSP unit 216 to process.

Figure 3:
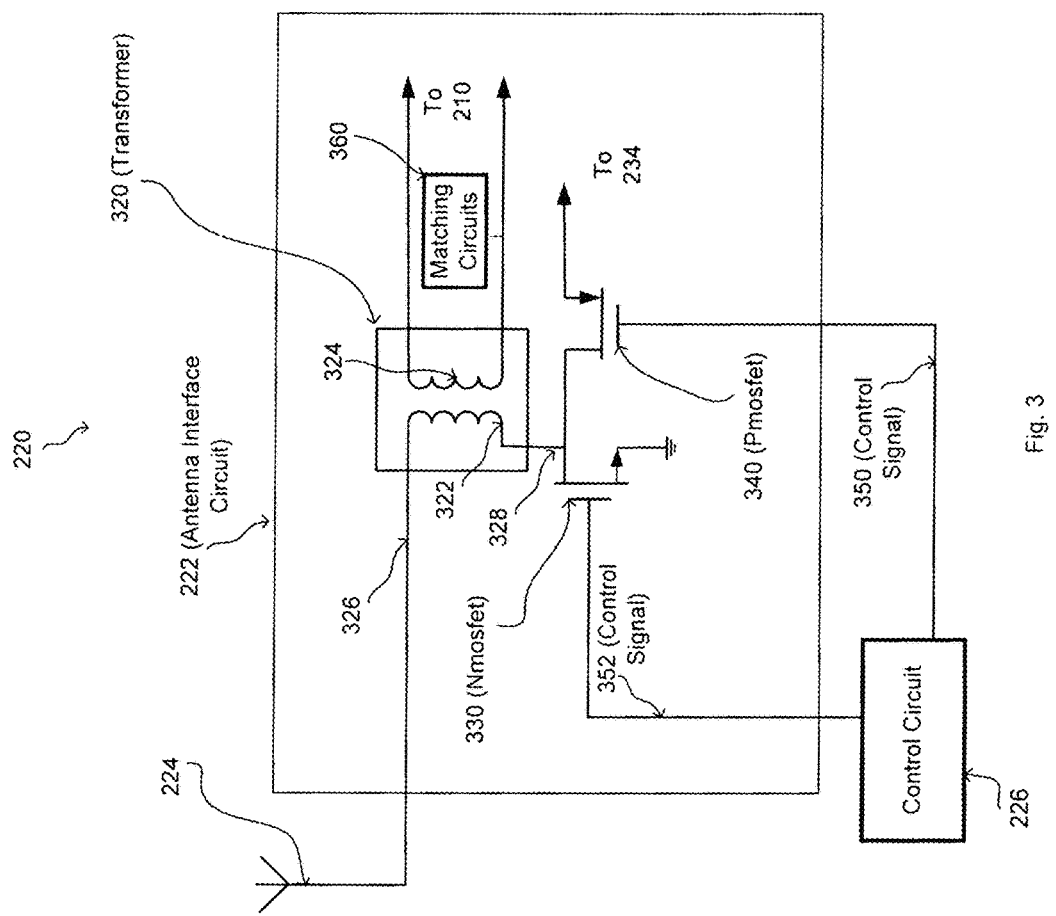
FIG. 3 illustrates an example schematic diagram of an antenna interface of the IoT system shown in FIG. 2 in accordance with one or more embodiments of the present disclosure.

FIG. 3 illustrates an example schematic diagram of the antenna interface unit 220 of the IoT system 200 shown in FIG. 2 in accordance with one or more embodiments of the present disclosure. The exemplary antenna interface unit 220 may include an antenna circuit 222, an antenna interface circuit 224 and a control unit 226. The exemplary antenna interface circuit 224 may include transformer 320, n-type metal-oxide-semiconductor field-effect transistor (NMOS-FET) 330, p-type metal-oxide-semiconductor field-effect transistor (PMOSFET) 340, and impedance-matching circuit 360. In one or more implementations, transformer 320 includes a primary winding set 322 and a secondary winding set 324. Furthermore, primary winding set 322 has two ends where one end is coupled to antenna circuit 222 and a second end is coupled to NMOSFET 330.

Impedance-matching circuit 360 is a circuit configured to maximize power transfer between an input and a load across the impedance-matching circuit 360 or minimize power reflection from the load. In one or more implementations, the secondary winding set 324 is the input to impedance-matching circuit 360, and IoT transceiver SoC 210 is the load to impedance-matching circuit 360. The impedance-matching circuit 360 may be implemented employing, by way of illustration only and not by way of limitation, capacitive networks, stepped-transmission lines and/or filters. In a particular embodiment, the transformer 320 may be configured to maximize power transfer eliminating the need for impedance-matching circuit 360.

In operation, antenna interface circuit 224 switches the antenna circuit 222 between IoT transceiver SoC 210 and FPSU 230 based on the mode of operation of the wireless system 200. For example, when IoT transceiver SoC 210 is in normal operation mode, the NMOSFET 330 is configured by control unit 226 to an ON operation mode via a first static control signal, which may correspond to control signal 352, while PMOSFET 340 is configured to an OFF operation mode by control unit 226 via a second static control signal, which may correspond to control signal 350. In normal operation mode, antenna circuit 222 is coupled to IoT transceiver SoC 210 where electromagnetic signals are transmitted and received from and/or to IoT transceiver SoC 210, respectively. In normal operation mode, in response to control signal 352 and control signal 350, the NMOSFET 330 is configured to the ON operation mode and PMOSFET 340 is configured to the OFF operation mode, allowing the electromagnetic waves to flow from the antenna circuit 222 to primary winding set 322 and transferred to secondary winding set 324. In one or more implementations, secondary winding set 324 is coupled to IoT transceiver SoC 210 through impedance-matching circuit 360 where impedance-matching circuit 360 is configured to maximize power transfer between the secondary winding set 324 and IoT transceiver SoC 210.

On the other hand, the energy harvesting mode is initiated when IoT transceiver SoC 210 is in sleep mode, where energy harvesting mode has two phases; harvesting mode I and harvesting mode II. In harvesting mode phase I, IoT transceiver SoC 210 is in sleep mode, the NMOSFET 330 is in the ON operation mode and PMOSFET 340 is configured to an OFF operation mode causing the current to flow through the primary winding set 322. The primary winding 322 set acts as an inductor which results in energy storage within the primary winding set 322. Harvesting mode phase II is configured upon the passage of a predetermined period of time from when harvesting mode phase I has started. In harvesting mode phase II, IoT transceiver SoC 210 is in sleep mode, NMOSFET 330 is configured by control circuit 226 to an OFF operation mode while PMOSFET 340 is configured to an ON operation mode, causing the energy stored in the primary winding set 322 to be transferred to harvest circuit 234. Control circuit 226 is utilized to coordinate timing of NMOSFET 330 and PMOSFET 340 to achieve maximum power transfer. Furthermore, impedance-matching circuit 360 is configured to set the input impedance of the antenna interface circuit 224 close to the input impedance of antenna circuit 222 to ensure maximum power transfer from the antenna interface circuit 224.

Figure 4:
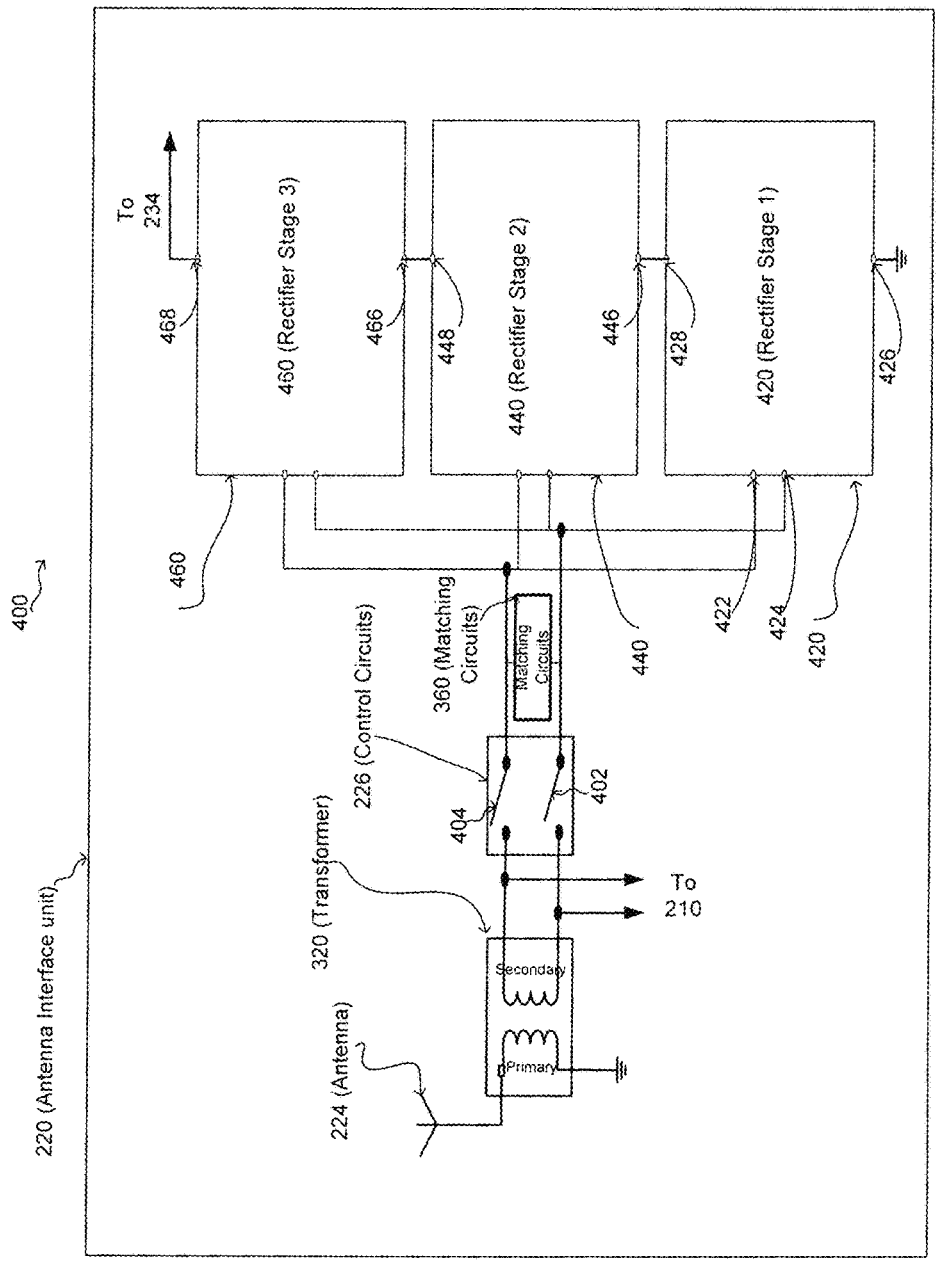
FIG. 4 illustrates a schematic diagram of an alternative embodiment of an antenna interface that enables antenna sharing in the IoT system shown in FIG. 2.

FIG. 4 illustrates a schematic diagram 400 of an alternative embodiment of the antenna interface 220 that enables antenna sharing in IoT system shown in FIG. 2. The exemplary antenna interface 220 may include antenna circuit 224, transformer 320, rectifier stage 1 420, rectifier stage 2 440, rectifier stage 3 460, control circuit 226 and impedance-matching circuit 360. Control circuit 226 may include switch 402 and switch 404. In one or more implementations, switch 402 and switch 404 may be electronic switches and rectifier stage 1 420, rectifier stage 2 440, rectifier stage 3 460 are a number of rectifier stages cascaded in a charge pump-like topology to increase the output voltage.

When IoT transceiver SoC 210 is in normal operation mode, control circuit 226 configures rectifier stage 1 420, rectifier stage 2 440 and rectifier stage 3 460 to be disconnected from transformer 320 by disconnecting switch 402 and switch 404. In this configuration, antenna circuit 224 and transformer 320 are coupled to IoT transceiver SoC 210, allowing electromagnetic waves from antenna circuit 222 to flow from/to IoT transceiver through transformer 320. On the other hand, when IoT transceiver SoC 210 is in sleep mode, control circuit 226 configures rectifier stage 1 420, rectifier stage 2 440 and rectifier stage 3 460 to be coupled to transformer 320 by connecting switch 402 and switch 404. In this configuration, antenna circuit 222 and transformer 320 are coupled to harvesting circuit 234 and are operated in energy harvesting mode. Furthermore, impedance-matching circuit 360 is configured to set the input impedance of the antenna interface circuit 224 close to the input impedance of antenna circuit 222 to ensure maximum power transfer from the antenna circuit 224.

Figure 5:
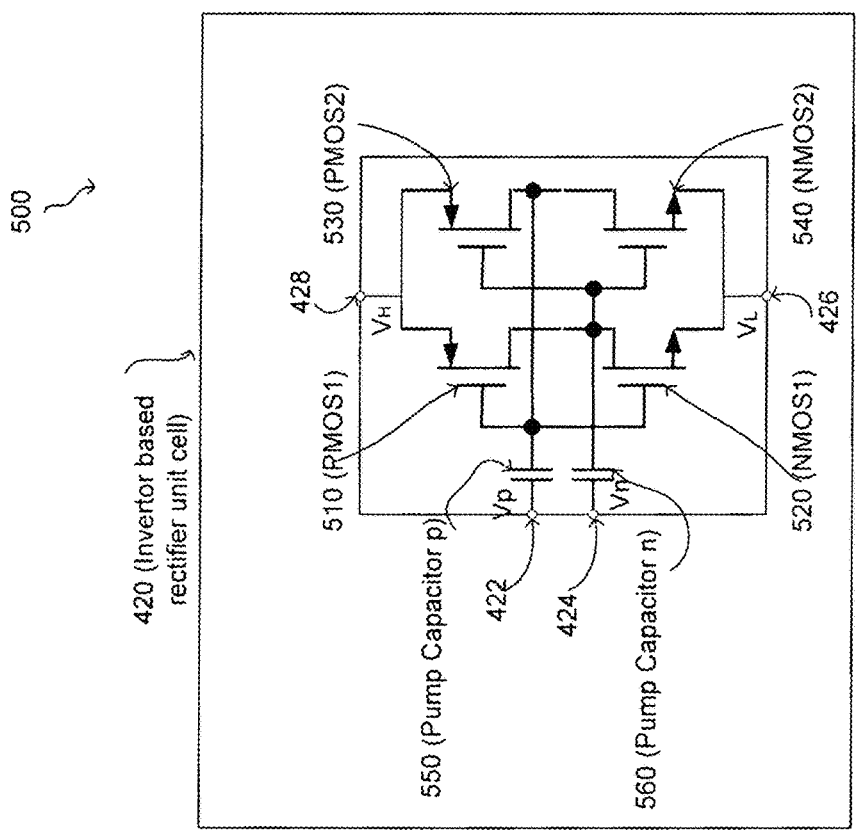
FIG. 5 illustrates a schematic diagram of an exemplary rectifier circuit of the antenna interface shown in FIG. 4 in accordance with one or more embodiments of the present disclosure.

FIG. 5 illustrates a schematic diagram of an exemplary rectifier circuit 500 as shown in FIG. 4 in accordance with one or more embodiments of the present disclosure. Rectifier stage 1 420, rectifier stage 2 440 and rectifier stage 3 460 may be rectifier circuit 500. The exemplary rectifier circuit 500 is a two cell inverter ring rectifier which may include cascade two stage inverter coupled in a ring configuration (e.g., PMOS1 510, PMOS2 530, NMOS1 520 and NMOS2 540), and pump capacitor at the input (e.g., pump capacitor p 550 and pump capacitor n 560). In one or more implementations, the rectifier stages 420, 440 and 460 are cascaded in a charge pump-like topology to increase output voltage as illustrated in FIG. 4. In this topology, electromagnetic waves are fed into each stage to input node Vp 422 and input node Vn 424 through pump capacitor p 550 and pump capacitor n 560. In this charge pump topology the direct current (DC) output VH 428 of rectifier stage 1 420 is an input to the next rectifier stage 2 440 at pin VL 446. Similarly, DC output VH 448 of rectifier stage 2 440 is an input to the next rectifier stage 3 460 at pin VL 466. The final stage DC output VH 468, is the final output voltage from rectifier 3 460 that is directed to harvesting circuit 234. In one or more implementations, the input node Vp 422 and input node Vn 424 correspond to a differential pair of input nodes configured to generate a differential input signal.

In one or more implementations, the number of rectifier stages of the charge pump topology is determined based on the desired DC output at the final stage VH 468 in the above example. The maximum value of VH that may be obtained from a single two cell inverter ring rectifier 500 is limited to 2VRF, where VRF is the input amplitude at input node 424 and input node 422. To obtain larger value DC output at final stage VH 468, N cells of two cell inverter ring rectifier 500 may be cascaded in series. The cascaded circuit behaves as a charge pump voltage multiplier.

In operation, during a first half of the switching cycle input node Vp 422 is high and input node Vn 424 is low. In this case, NMOS1 520 and PMOS2 530 are configured to an ON operation mode and NMOS2 540 and PMOS1 510 are configured to an OFF operation mode allowing current to flow into VH 428 through PMOS2 530 and out of VL 426 through NMOS1 520. During a second half of the switching cycle, NMOS2 540 and PMOS1 510 are configured to an ON operation mode and NMOS1 520 and PMOS2 530 are configured to an OFF operation mode, allowing the current to flow into VH 428 through PMOS1 410 and out of VL 426 through NMOS2 530. In one or more implementations, the current has the same direction in the first half of the switching cycle and the second half of the switching cycle. Thus a DC voltage VL is developed across a load coupled between VH 428 and VL 426. In general, the DC voltage VL across the load VL=VH−VL=2VRF−Vdrop, where VRF is the AC voltage amplitude of input node Vp 422 or input node Vn 424 and Vdrop represent losses due to switch resistance and reverse conduction.

Figure 6:
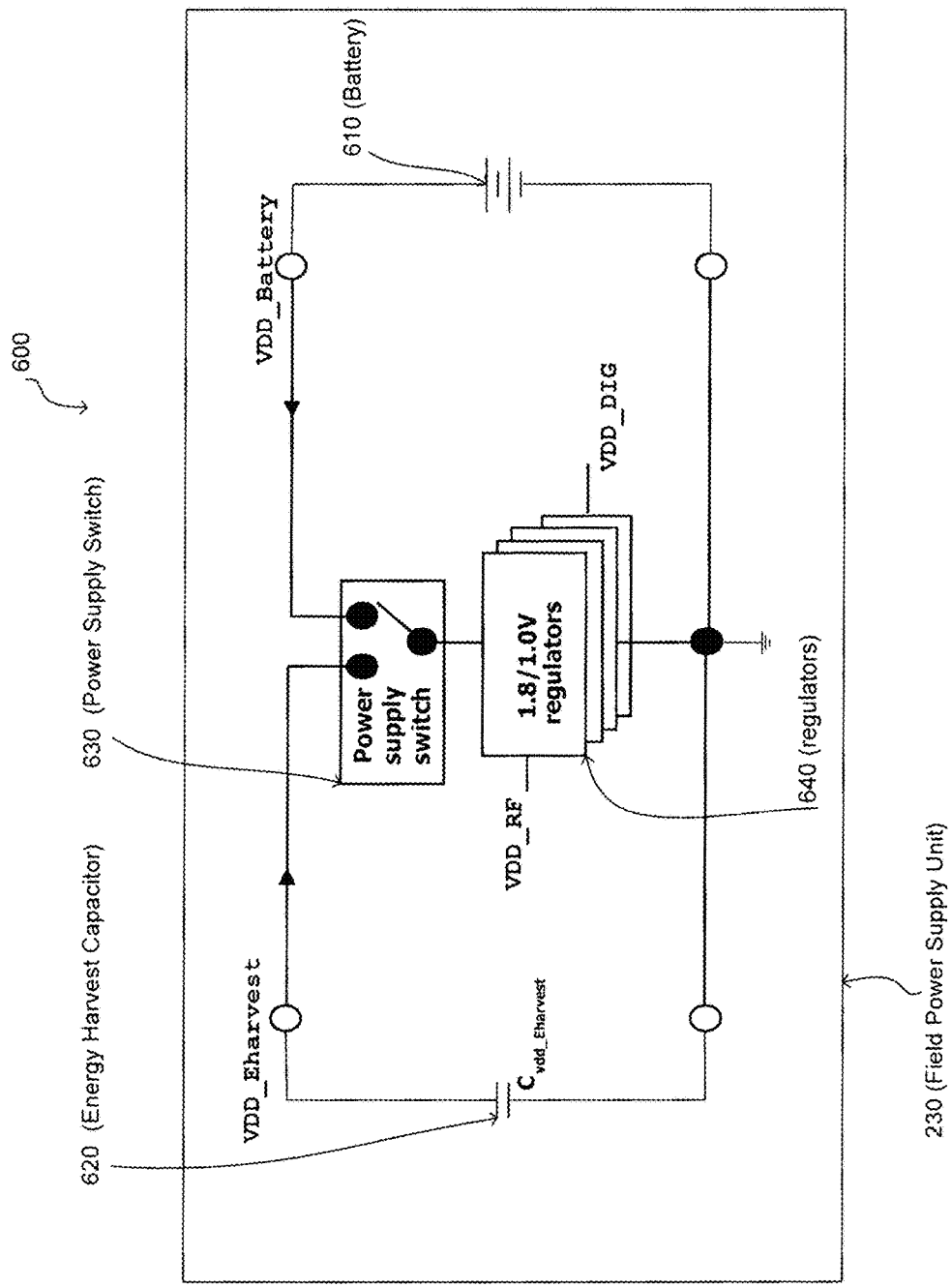
FIG. 6 illustrates an example schematic diagram of a field power supply unit (FPSU) of the IoT system shown in FIG. 2, in accordance with one or more embodiments of the present disclosure.

FIG. 6 illustrates an example schematic diagram of FPSU 600 of the IoT system shown in FIG. 2, in accordance with one or more embodiments of the present disclosure. FPSU 230 may include battery 610 (e.g., a lithium battery), energy harvest capacitor 620, power supply switch 630 and regulators 640. In one or more implementations, energy harvesting circuit 234 includes an electric device that is capable of storing electric energy (e.g., energy harvest capacitor 620) when disconnected from a charging circuit (e.g., primary winding set 322) and a second electric device that is capable of supplying power (e.g., battery 610). In some aspects, power supply circuit 232 may include battery 610, power supply switch 630 and regulators 640, while harvesting circuit 234 may include at least energy harvest capacitor 620.

Examples of energy harvest capacitor 620 may be, by way of illustration only and not by way of limitation, a passive capacitor such as a ceramic capacitor, a film capacitor, an electrolytic capacitor (e.g., an aluminum electrolytic capacitor), printed circuit capacitor, on-chip passive capacitor, glass capacitor, or a supercapacitor (SC). In one or more implementations, energy harvest capacitor 620 is an active capacitor implemented by configuring an on-chip active device to behave as a capacitor. In a particular embodiment, energy harvest capacitor 620 is a combination of a passive capacitor and an active capacitor.

In one or more implementations, one or more of regulators 640 are used to supply an RF voltage supply (VDD_RF) and a digital voltage supply (VDD_DIG) to operate analog and digital circuits, respectively, in the IoT transceiver SoC 210. Voltage regulators 640 may be electrical components or electromechanical components. The voltage regulators 640 may be a feed-forward circuit design or a negative feedback control circuit design. In one or more implementations, switch 630 is an analog switch or an electromechanical switch. For example, by way of illustration only and not by way of limitation, an analog switch may be a bilateral switch topology where a pair of MOSFET transistors one is negative channel MOSFET (NMOSFET) device and the second is a positive channel MOSFET (PMOSFET) device.

In operation, the FPSU 230 is a dual mode operation device. For example during the sleep mode of IoT transceiver SoC 210, the FPSU 230 is configured in energy harvesting mode, harvesting energy via antenna interface unit 220 as depicted in FIG. 3 and FIG. 4 and storing energy in energy harvest capacitor 620. On the other hand, in the normal operation mode of IoT transceiver SoC 210, FPSU 230 is configured in a normal operation mode and provides power from battery 610 to IoT transceiver SoC 210. In one or more implementations, FPSU 230 may provide energy for IoT transceiver SoC 210 and antenna interface unit 220 during sleep mode and normal operation mode. In some aspects, power supply switch 630 is configurable to select energy source based on IoT transceiver SoC 210 operation mode, i.e. coupled to energy harvest capacitor 620 (e.g., VDD_Eharvest) during sleep mode, and coupled to battery 610 (e.g., VDD_Battery) during normal operation mode.

Figure 7:
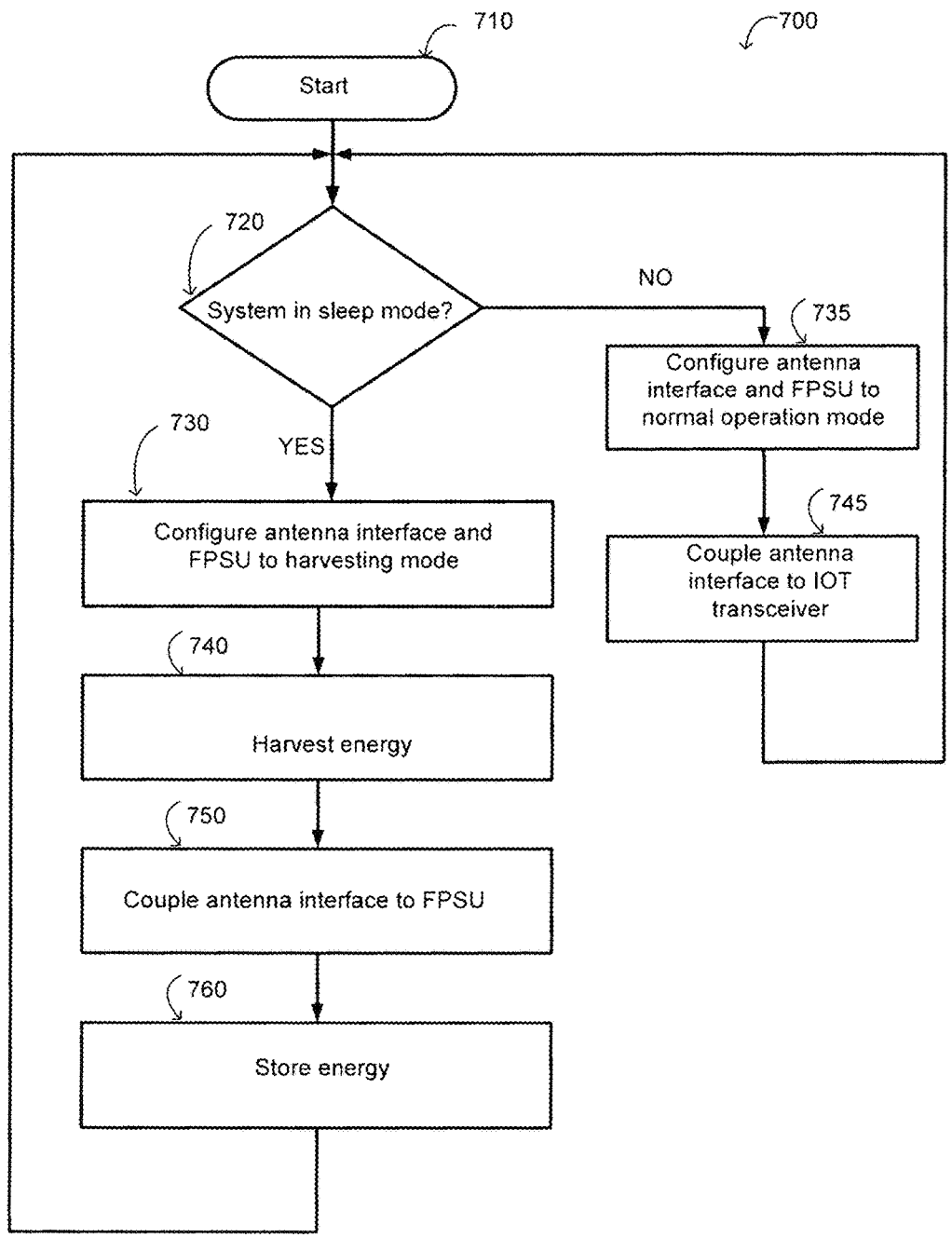
FIG. 7 illustrates a flow chart of a method to configure an IoT system in a normal operation mode and a harvesting operation mode.

FIG. 7 illustrates a flowchart of a method 700 to configure an IoT system in a normal operation mode and a harvesting operation mode. The IoT system may correspond to IoT system 200 described in FIG. 2 where an antenna interface may correspond to 220 and FPSU may correspond to 230. The method includes determining when the IoT transceiver SoC 210 is in a sleep mode at step 720. Based on the determination when the IoT transceiver SoC 210 is in a sleep mode, the antenna interface unit 220, and the FPSU 230 are configured to a harvesting operation mode as shown at step 730. Once the IoT system 200 is configured to the harvesting mode, electromagnetic waves are intercepted with antenna circuit 222 and energy harvesting the electromagnetic waves starts as depicted at step 740.

In one or more implementations, at step 750 the antenna interface unit 210 is coupled to FPSU 230 after the passage of a predetermined period of time from the moment the energy harvesting started in step 740. At 760, upon the coupling of antenna interface 210 and FPSU 230 the harvested energy by antenna interface 210 is directed to be stored in harvesting circuit 234 for processing and further use. In response to completion of step 760 the system returns to step 720 and checks the status of the IoT system 200; determining whether the system is still in sleep mode or is in normal operation mode.

In some aspects, the energy harvesting process may be divided into smaller intervals of predetermined periods that amount to a total period of time (e.g., a total of 40 minutes divided into smaller predetermined intervals of 10 minutes totaling 4 predetermined periods of time T1, T2, T3 and T4 hereafter referred to as T1-T4). The division of the predetermined periods T1-T4 may be determined based on the capacity of the harvesting components within antenna circuit 222 (e.g., transformer 320) and harvesting circuit 234 (e.g., energy harvest capacitor 620). For example, in operation, the passage of a first predetermined period of time T1 is determined from the first moment the energy harvesting started in step 740 and upon the completion of step 760 where the harvested energy is stored at harvesting circuit 234. In response to the passage of the first predetermined period T1, a second predetermined period of time T2 of harvesting energy is initiated where the method executes step 740 marking the start of the second predetermined period of energy harvesting and taking the system through step 740-760.

At step 735, when the determination of step 720 indicates the IoT system 200 is not in a sleep mode (i.e., in normal operation mode) the antenna interface unit 220 and the FPSU 230 are configured to a normal operation mode. Further, at step 745 the antenna interface unit 220 is coupled to IoT transceiver SoC 210 to operate the IoT system 200 in a normal operation mode.

FIG. 8 illustrates conceptually an example electronic system 800 with which some implementations of the present disclosure may be implemented. Electronic system 800 may be a gateway device, a set-top box, a computer (e.g., desktop computer or laptop computer), a phone, a personal digital assistant (PDA), a server, a switch, a router, a base station, a receiver, or any other sort of electronic device that transmits signals over a network, such as electronic devices embedded in smart appliances and other smart systems. The electronic system 800 may be, and/or may be a part of, the proxy device (e.g., within 102A in FIG. 1) and/or one or more of the devices (e.g., 104A-104L in FIG. 1). For example, the electronic system 800 may be a sensor, an active device, and/or an actuator. Such an electronic system includes various types of computer readable media and interfaces for various other types of computer readable media.

The electronic system 800 may include a processor 810, such as a digital signal processor (DSP) 216. The processor 810 may be coupled to a computer-readable storage medium, such as a memory 832 (e.g., a non-transitory computer-readable medium), via a transceiver 850. The transceiver 850 may correspond to the second circuit 210 (e.g., IoT transceiver SoC 210) as depicted in FIG. 2. Moreover, as depicted in FIG. 8, the processor 810 may be external transceiver 850. For example, the processor 810 may be "off-chip" with respect to the transceiver 850. In another embodiment, the processor 810 and the transceiver 850 are integrated within a system-in-package or system-on-chip device 822, as explained further below.

The memory 832 may store instructions 854 that are executable by the processor 810, data 856 that is accessible to the processor 810, or a combination thereof. In a particular embodiment, the memory 832 is a volatile memory that is accessible to the processor via transceiver 850. FIG. 8 also shows a display controller 826 that is coupled to the processor 810 and to a display 828. A coder/decoder (CODEC) 834 may also be coupled to the processor 810. A speaker 836 and a microphone 838 may be coupled to the CODEC 834. FIG. 8 also indicates that a wireless controller 840 may be coupled to the processor 810. The wireless controller may be further coupled to an antenna 842 via a transceiver 850. A camera 846 may be coupled to a camera controller 890. The camera controller 890 may be coupled to the processor 810. The wireless controller may correspond to control unit 226 as depicted in FIG. 2.

In a particular embodiment, the processor 810, the memory 832, the display controller 826, the camera controller 890, the CODEC 834, the wireless controller 840, and the transceiver 850 are included in the system-in-package or system-on-chip device 822. An input device 830 and a power supply 844 may be coupled to the system-on-chip device 822. The power supply 844 may correspond to the third circuit 230 as depicted in FIG. 2. Moreover, in a particular embodiment, and as illustrated in FIG. 8, the display 828, the input device 830, the camera 846, the speaker 836, the microphone 838, the antenna 842, and the power supply 844 are external to the system-on-chip device 822. However, each of the display 828, the input device 830, the camera 846, the speaker 836, the microphone 838, the antenna 842, and the power supply 844 may be coupled to a component of the system-on-chip device 822. As a particular example, the processor 810 and the memory 832 are coupled to transceiver 850.

In connection with the present disclosure, a computer-readable storage medium (e.g., the memory 832) stores data (e.g., the data 856) that is accessible to a processor (e.g., the processor 810) during modes of operation of transceiver 850. The data 856 may be a method instructions as depicted in FIG. 7. The method instructions are executable by processor 810, where the instructions include steps on how to operate and configure the IoT system 200 during the modes of operation of transceiver 850. During the sleep mode of transceiver 850, the processor executes the method instructions to configure the power supply 884 and a front end interface 860 in an energy harvesting mode. The front end interface 860 corresponds to the first circuit as depicted in FIG. 2. On the other hand, during the normal operation mode of the transceiver 850, the processor executes the method instructions to configure the power supply 884 and the front end interface 860 in a normal operation mode.

Finally, as shown in FIG. 8, electronic system 800 couples to a network (e.g., 102A) through a network interface 816. In this manner, the electronic system 800 may be a part of a network of computers (for example, a local area network (LAN), a wide area network (WAN), or an Intranet, or a network of networks, for example, the Internet. Any or all components of electronic system 800 may be used in conjunction with the subject disclosure. The network interface 816 may include cellular interfaces, WiFi interfaces, Infrared interfaces, RFID interfaces, ZigBee interfaces, Bluetooth interfaces, Ethernet interfaces, coaxial interfaces, optical interfaces, or generally any communication interface that may be used for device communication. The communications may be performed with a network environment such as the network environment 100 of FIG. 1.

Those of skill in the art will appreciate that the foregoing disclosed systems and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are separated into semiconductor dies and packaged into semiconductor chips. The semiconductor chips are then employed in devices, such as the IoT system 200, the electronic system 800, or a combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor may read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor, and the storage medium may reside as discrete components in a computing device or user terminal.

Further, specific details are given in the description to provide a thorough understanding of the embodiments. However, embodiments may be practiced without these specific details. For example, well-known circuits, processes, algorithms, structures, and techniques have been shown without unnecessary detail in order to avoid obscuring the embodiments. This description provides example embodiments only and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Where applicable, various embodiments provided by the present disclosure may be implemented using hardware, software, or combinations of hardware and software. In addition, where applicable, the various hardware components and/or software components, set forth herein, may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer-readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device. As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the present disclosure, the disclosure, the present disclosure, other variations thereof and alike are for convenience and do not imply that a disclosure relating to such phrase(s) is essential to the present disclosure or that such disclosure applies to all configurations of the present disclosure. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
   a first circuit, comprising:
   a transformer with a primary winding set, wherein the primary winding set has a first end and a second end, wherein the first end is coupled to an antenna circuit configured to receive and transmit electromagnetic waves;
   an n-type-metal-oxide-semiconductor-field-effect-transistor (NMOSFET); and
   a p-type-metal-oxide-semiconductor-field-effect-transistor (PMOSFET), wherein the second end is coupled to the drain of the NMOSFET and the drain of the PMOSFET, and wherein the NMOSFET and PMOSFET are configurable to an ON mode and an OFF mode via a first control signal received at the gate of the PMOSFET and a second control signal received at the gate of the NMOSFET;
   wherein the transformer comprises a secondary winding set; wherein the secondary winding set is coupled to a second circuit comprising at least one of a data receiver or a data transmitter, and wherein the source of the PMOSFET is coupled to a power harvesting storage unit; and
   wherein in a normal operation mode the NMOSFET is set to an ON mode and the PMOSFET is set to an OFF mode such that an electromagnetic wave is transferred between the antenna circuit and the second circuit across the transformer, and when the second circuit is in a sleep mode, the NMOSFET is set to an ON mode and the PMOSFET is set to an OFF mode such that energy is stored in the primary winding set and then passed to the power harvesting storage unit when the NMOSFET is switched to an OFF mode and the PMOSFET switched to an ON mode upon the passage of a predetermined period of time.

2. The device of claim 1, wherein the first circuit comprises an impedance-matching circuit coupled to the secondary winding set at one end of the impedance-matching circuit and coupled to the second circuit at a second end of the impedance-matching circuit.

3. A system comprising:
   a first circuit comprising a transformer with a primary winding set and a secondary winding set, wherein a first end of the primary winding set is coupled to an antenna circuit configured to transmit and receive electromagnetic waves and a second end of the primary winding set is coupled to at least one switching element, wherein the first circuit is configured to operate in a plurality of operation modes, wherein the plurality of operation modes comprises a normal operation mode wherein the electromagnetic waves flow between the primary winding set and the secondary winding set, and an energy harvesting mode wherein the electromagnetic waves are stored in the primary winding set and then flow from the primary winding set to a power harvesting storage unit via the at least one switching element;

a second circuit coupled to the first circuit through the secondary winding set, wherein the second circuit comprises at least one of a data receiver or a data transmitter, wherein the second circuit is configured to transmit or receive the electromagnetic waves during the normal operation mode, and configured to be in a sleep mode during the energy harvesting mode; and a third circuit comprising the power harvesting storage unit, coupled to the first circuit and the second circuit, wherein the third circuit is configured to store energy from the electromagnetic waves in the power harvesting storage unit when the first circuit is configured in the energy harvesting mode and the second circuit is configured in the sleep mode.

4. The system of claim 3, wherein the first circuit comprises a control unit, and the at least one switching element comprises a plurality of FETs controlled to configure the first circuit to one or more operation modes from the plurality of operation modes.

5. The system of claim 4, wherein the second circuit comprises the data receiver and further comprises a digital signal processing (DSP) unit coupled to the data receiver; wherein the DSP unit and the data receiver are a system on chip (SoC) device.

6. The system of claim 5, wherein the DSP unit comprises a central control unit of the system, the central control unit being coupled to the second circuit, the first circuit, and the third circuit.

7. The system of claim 6, wherein the central control unit is configured to receive instruction from the DSP unit.

8. The system of claim 4, wherein the plurality of FETs comprises an n-type-metal-oxide-semiconductor-field-effect-transistor (NMOSFET) and a p-type-metal-oxide-semiconductor-field-effect-transistor (PMOSFET), wherein a drain of the NMOSFET is coupled to a drain of the PMOSFET, and wherein the NMOSFET and PMOSFET are configurable to an ON mode and an OFF mode.

9. The system of claim 8, wherein the first end is coupled to the drain of the NMOSFET.

10. The system of claim 9, wherein, when the NMOSFET is in the ON mode and the PMOSFET is in the OFF mode during the normal operation mode and the system is configured to allow flow of electromagnetic waves from the primary winding set to the secondary winding set of the transformer.

11. The system of claim 9, wherein:
during the sleep mode of the second circuit, the NMOSFET is switched to the ON mode and the PMOSFET is switched to the OFF mode and the system is configured to store energy from the electromagnetic waves within the primary winding set; and
when the NMOSFET is switched to the OFF mode and the PMOSFET is switched to the ON mode, the system is configured to direct the stored energy from the primary winding set to a harvesting circuit of the third circuit.

12. The system of claim 3, wherein the third circuit comprises a harvesting circuit configured to store harvested energy and wherein the harvesting circuit comprises a capacitor.

13. The system of claim 3, wherein the third circuit comprises a power supply switch controlled to switch when changing between the normal operation mode and the energy harvesting mode.

14. A method for operating a system, the system comprising a first circuit comprising a transformer with a primary winding set and a secondary winding set, wherein a first end of the primary winding set is coupled to an antenna circuit configured to transmit and receive electromagnetic waves and a second end of the primary winding set is coupled to at least one switching element; a second circuit coupled to the first circuit through the secondary winding set, wherein the second circuit comprises at least one of a data receiver or a data transmitter; and a third circuit comprising a power harvesting storage unit, coupled to the first circuit and the second circuit; the method comprising:
operating the second circuit to transmit or receive the electromagnetic waves during a normal operation mode, and limiting flow of the electromagnetic waves to the second circuit during a sleep mode of the second circuit;
when in the normal operation mode, configuring the first circuit such that the electromagnetic waves flow between the primary winding set and the secondary winding set;
when the second circuit is in the sleep mode, configuring the first circuit to operate in an energy harvesting mode wherein the electromagnetic waves are stored in the primary winding set and then flow from the primary winding set to the power harvesting storage unit via the at least one switching element; and
configuring the third circuit to store energy from the electromagnetic waves in the power harvesting storage unit when the first circuit is configured in the energy harvesting mode and the second circuit is in the sleep mode.

15. The method of claim 14, wherein the energy harvesting mode lasts for a predetermined period of time.

* * * * *